(12) United States Patent
Takahashi et al.

(10) Patent No.: US 11,417,862 B2
(45) Date of Patent: Aug. 16, 2022

(54) DISPLAY DEVICE INCLUDING LEAD WIRING LINES COVERED BY FIRST AND SECOND ORGANIC FILMS, AND PRODUCTION METHOD THEREFOR

(71) Applicant: SHARP KABUSHIKI KAISHA, Sakai (JP)

(72) Inventors: Jumpei Takahashi, Sakai (JP); Akihiro Matsui, Sakai (JP); Takashi Ochi, Sakai (JP); Tohru Sonoda, Sakai (JP); Yoshinobu Miyamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 189 days.

(21) Appl. No.: 16/977,298

(22) PCT Filed: Mar. 2, 2018

(86) PCT No.: PCT/JP2018/008096
§ 371 (c)(1),
(2) Date: Sep. 1, 2020

(87) PCT Pub. No.: WO2019/167270
PCT Pub. Date: Sep. 6, 2019

(65) Prior Publication Data
US 2021/0005842 A1 Jan. 7, 2021

(51) Int. Cl.
*H01L 51/52* (2006.01)
*H01L 27/32* (2006.01)
*H01L 51/56* (2006.01)

(52) U.S. Cl.
CPC ...... *H01L 51/5253* (2013.01); *H01L 27/3276* (2013.01); *H01L 51/56* (2013.01); *H01L 2227/323* (2013.01)

(58) Field of Classification Search
CPC .......... H01L 27/3276; H01L 2227/323; H01L 51/5253; H01L 51/56
USPC .......................................................... 257/40
See application file for complete search history.

(56) References Cited

U.S. PATENT DOCUMENTS

| 2011/0006972 A1* | 1/2011 | Tanaka | H01L 27/3276 345/76 |
| 2021/0351263 A1* | 11/2021 | Okabe | H05B 33/22 |
| 2022/0020958 A1* | 1/2022 | Okabe | G09F 9/00 |

FOREIGN PATENT DOCUMENTS

| EP | 3336667 A1 * | 6/2018 | ........... G06F 3/0412 |
| JP | 2006-278021 A | 10/2006 | |
| JP | 2007-172873 A | 7/2007 | |
| JP | 2010-218940 A | 9/2010 | |
| JP | 2011-018686 A | 1/2011 | |
| JP | 2011-034996 A | 2/2011 | |

* cited by examiner

*Primary Examiner* — Matthew E. Gordon
(74) *Attorney, Agent, or Firm* — ScienBiziP, P.C.

(57) ABSTRACT

Each of lead wiring lines that constitutes a TFT layer and is provided to extend parallel to each other in a frame region extends to intersect with a perimeter edge surface of a first organic film that constitutes the TFT layer and is provided on each of the lead wiring lines. A second organic film is provided to cover a lower portion of the perimeter edge surface of the first organic film and each of the lead wiring lines on a side of the perimeter edge surface of the first organic film, the lead wiring lines extending from the perimeter edge surface of the first organic film.

8 Claims, 11 Drawing Sheets

DISPLAY DEVICE INCLUDING LEAD WIRING LINES COVERED BY FIRST AND SECOND ORGANIC FILMS, AND PRODUCTION METHOD THEREFOR

TECHNICAL FIELD

The disclosure relates to a display device and a method of manufacturing the same.

BACKGROUND ART

In recent years, organic EL display devices, which use organic electroluminescence (EL) elements and are of the self-luminous type, have attracted attention as a display device that can replace the liquid crystal display device. In the organic EL display device, for example, there are provided a rectangular display region for displaying an image and a frame region formed in a periphery of the display region. Here, a lead wiring line for supplying electrical signals to each of display wiring lines disposed in the display region is provided in the frame region (for example, see PTL 1).

CITATION LIST

Patent Literature

PTL 1: JP 2011-34996 A

SUMMARY

Technical Problem

An organic EL display device includes, for example, a resin substrate, a thin film transistor (TFT) layer provided on the resin substrate, and an organic EL element provided on the TFT layer. Here, the TFT layer includes a plurality of lead wiring lines provided to extend parallel to each other in a frame region, and a flattening film being provided on each of the lead wiring lines and having a flat surface in a display region. The organic EL element includes, for example, a plurality of first electrodes, an edge cover, a plurality of organic EL layers, a second electrode, and a sealing film, which are provided in the order stated, over the flattening film. A perimeter edge surface of the flattening film is inclined at, for example, 30° or greater with respect to a surface of the resin substrate. Therefore, when a metal film is formed to cover the flattening film and the metal film is patterned by photolithography to form the first electrodes, a resist pattern on the metal film may not be formed in a desired shape. Specifically, the resist pattern is formed to be thicker at a perimeter edge portion of the flattening film and a portion overlapping a periphery thereof, and thus, undesirable resist patterns may remain in the periphery of the flattening film. Thus, residues of the metal film are interposed between the plurality of lead wiring lines, which may lead to a short-circuit of the plurality of lead wiring lines.

The disclosure has been made in view of the above, and an object of the disclosure is to suppress a short-circuit between lead wiring lines.

Solution to Problem

To achieve the above-described object, a display device according to the disclosure includes a base substrate, a TFT layer provided on the base substrate, a light-emitting element provided on the TFT layer, the light-emitting element constituting a display region, a frame region provided in a periphery of the display region, a plurality of lead wiring lines provided to extend parallel to each other in the frame region, the plurality of lead wiring lines constituting the TFT layer, a first organic film provided on each of the plurality of lead wiring lines, the first organic film constituting the TFT layer, and a plurality of pixel electrodes provided on the first organic film, the plurality of pixel electrodes constituting the light-emitting element. Each of the plurality of lead wiring lines extends to intersect with a perimeter edge surface of the first organic film, and a second organic film is provided to cover a lower portion of the perimeter edge surface of the first organic film and each of the plurality of lead wiring lines on a side of the perimeter edge surface of the first organic film, the plurality of lead wiring lines extending from the perimeter edge surface of the first organic film.

Advantageous Effects of Disclosure

According to the disclosure, a second organic film is provided to cover a lower portion of a perimeter edge surface of a first organic film and each of lead wiring lines on a side of the perimeter edge surface of the first organic film, the lead wiring lines extending from the perimeter edge surface of the first organic film, and thus, a short-circuit between the lead wiring lines can be suppressed.

BRIEF DESCRIPTION OF DRAWINGS

FIG. 13 is a view corresponding to FIG. 12.

FIG. 16 is a view corresponding to FIG. 11.

FIG. 18 is a view corresponding to FIG. 6.

DESCRIPTION OF EMBODIMENTS

Embodiments of the disclosure will be described below in detail with reference to the drawings. The disclosure is not limited to the embodiments described below.

First Embodiment

Figure 1:
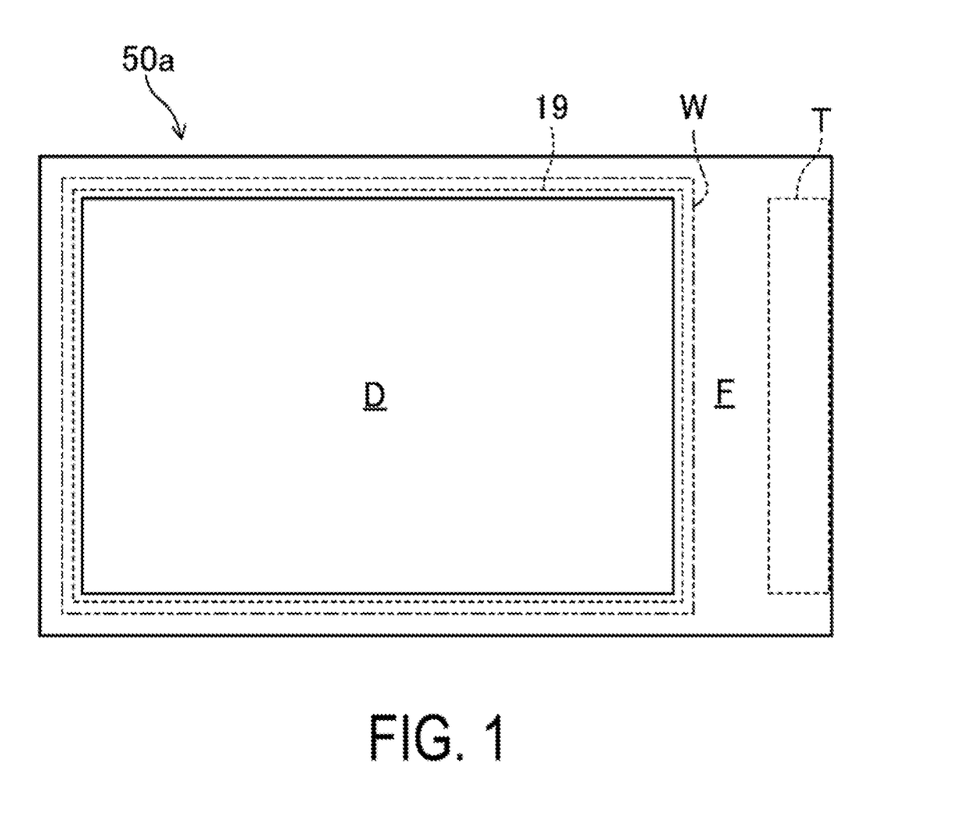
FIG. 1 is a plan view illustrating an overall configuration of an organic EL display device according to a first embodiment of the disclosure.
Figure 2:
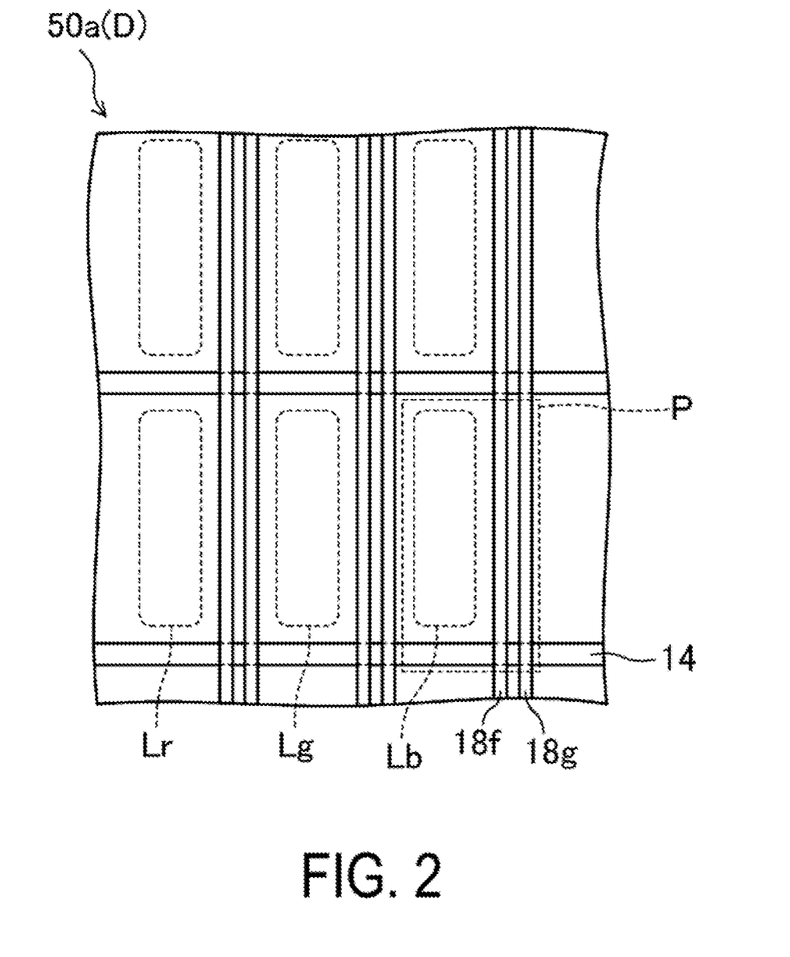
FIG. 2 is a plan view of a display region of the organic EL display device according to the first embodiment of the disclosure.
Figure 3:
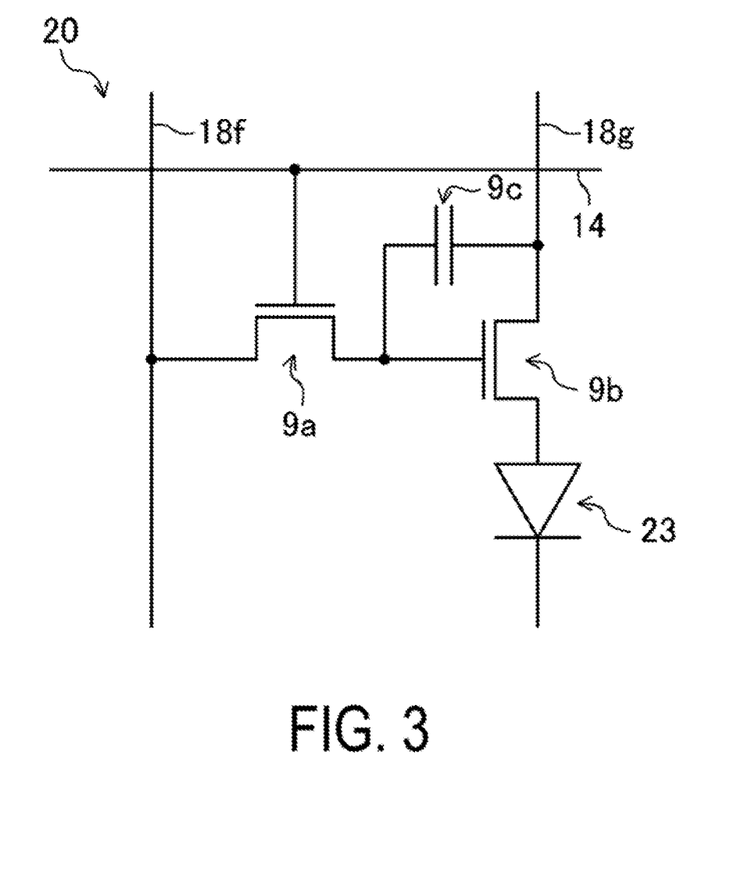
FIG. 3 is an equivalent circuit diagram illustrating a TFT layer constituting the organic EL display device according to the first embodiment of the disclosure.
Figure 4:
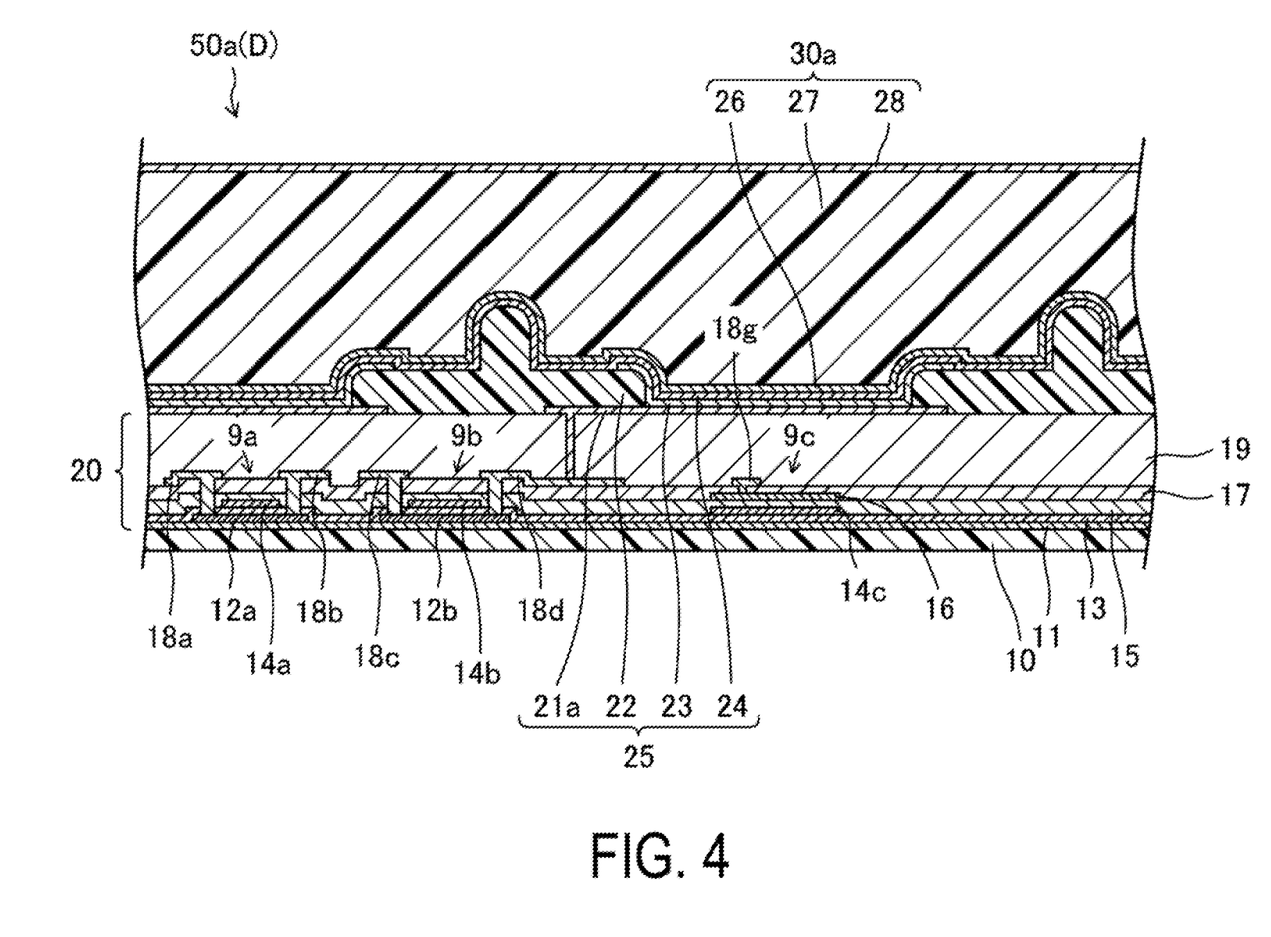
FIG. 4 is a cross-sectional view of the display region of the organic EL display device according to the first embodiment of the disclosure.
Figure 5:
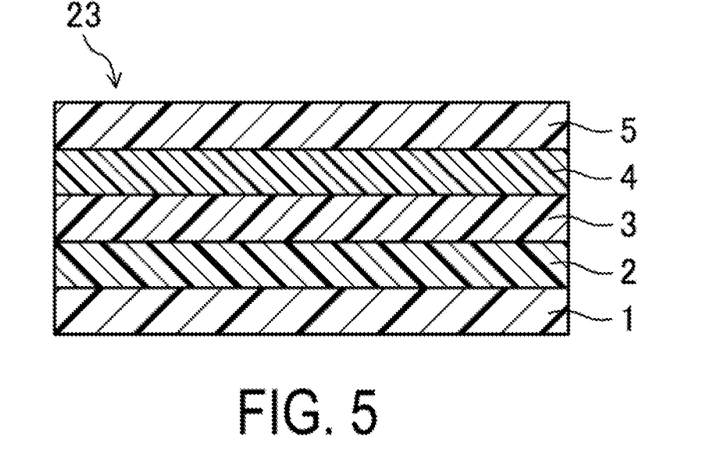
FIG. 5 is a cross-sectional view of an organic EL layer constituting the organic EL display device according to the first embodiment of the disclosure.
Figure 6:
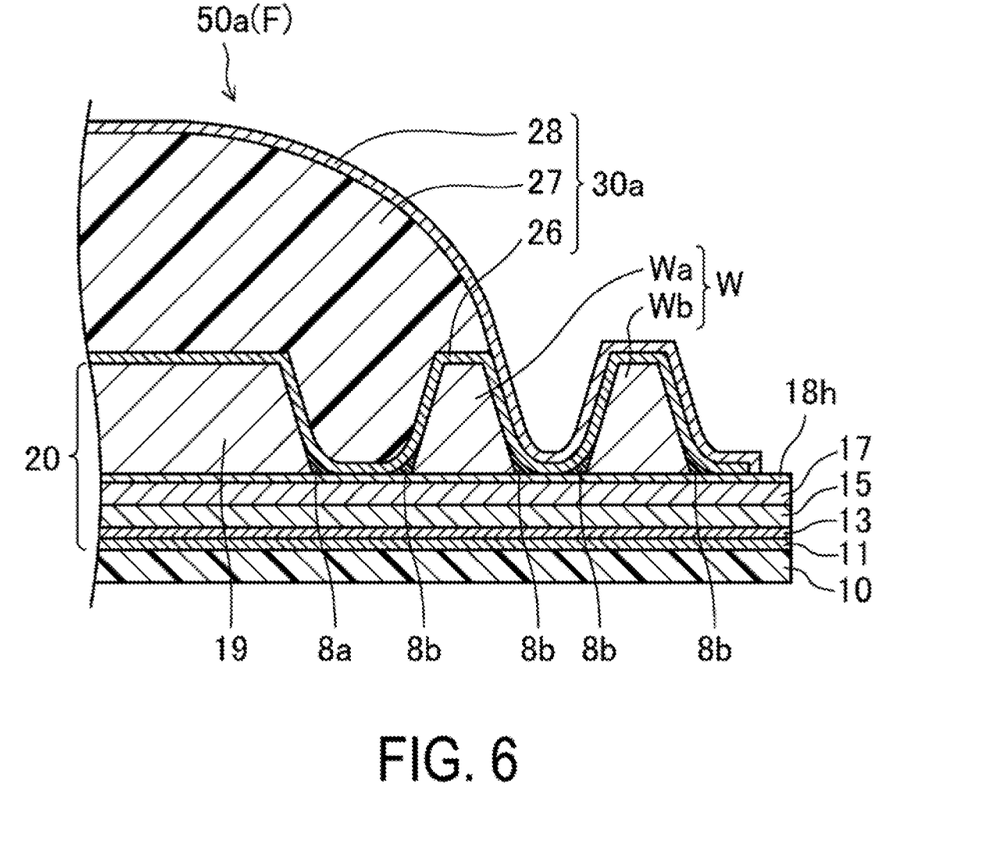
FIG. 6 is a cross-sectional view of a frame region of the organic EL display device according to the first embodiment of the disclosure.

FIGS. 1 to 16 illustrate a first embodiment of a display device and a method of manufacturing the same according to the disclosure. Note that, in each of the following embodiments, an organic EL display device including an organic EL element will be exemplified as a display device including a light-emitting element. Here, FIG. 1 is a plan view illustrating an overall configuration of an organic EL display device 50a according to the present embodiment. FIG. 2 is a plan view of a display region D of the organic EL display device 50a. FIG. 3 is an equivalent circuit diagram illustrating a TFT layer 20 constituting the organic EL display device 50a. FIG. 4 is a cross-sectional view of the display region D of the organic EL display device 50a. FIG. 5 is a cross-sectional view of an organic EL layer 23 constituting the organic EL display device 50a. FIG. 6 is a cross-sectional view of a frame region F of the organic EL display device 50a.

As illustrated in FIG. 1, the organic EL display device 50a includes, for example, the display region D, in a rectangular shape, for displaying an image, and the frame region F provided in a periphery of the display region D. Here, a plurality of subpixels P are disposed in a matrix shape in the display region D, as illustrated in FIG. 2. In the display region D, a subpixel P including a red light-emitting region Lr configured to execute a red display, a subpixel P including a green light-emitting region Lg configured to execute a green display, and a subpixel P including a blue light-emitting region Lb configured to execute a blue display are provided adjacent to one another, as illustrated in FIG. 2. One pixel is constituted of the three adjacent subpixels P including the red light-emitting region Lr, the green light-emitting region Lg, and the blue light-emitting region Lb, respectively in the display region D. A terminal region T is provided at the right end portion of the frame region F in FIG. 1.

As illustrated in FIG. 4, the organic EL display device 50a includes, in the display region D, a resin substrate layer 10 provided as a base substrate, a TFT layer 20 provided on the resin substrate layer 10, an organic EL element 25 provided, on the TFT layer 20, as a light-emitting element constituting the display region D, and a sealing film 30a provided to cover the organic EL element 25.

The resin substrate layer 10 is formed, for example, of a polyimide resin or the like.

As illustrated in FIG. 4, the TFT layer 20 includes a base coat film 11 provided on the resin substrate layer 10, a plurality of first TFTs 9a, a plurality of second TFTs 9b, and a plurality of capacitors 9c, which are provided on the base coat film 11, and a flattening film 19 provided, as a first organic film, on each of the first TFTs 9a, each of the second TFTs 9b, and each of the capacitors 9c. Here, in the TFT layer 20, as illustrated in FIGS. 2 and 3, a plurality of gate lines 14 are provided to extend parallel to each other in a horizontal direction in the figures. In the TFT layer 20, as illustrated in FIGS. 2 and 3, a plurality of source lines 18f are provided to extend parallel to each other in a vertical direction in the figures. In the TFT layer 20, as illustrated in FIGS. 2 and 3, a plurality of power source lines 18g are provided to extend parallel to each other in the vertical direction in the figures while being disposed adjacent to each of the source lines 18f. In the TFT layer 20, as illustrated in FIG. 3, each subpixel P includes the first TFT 9a, the second TFT 9b, and the capacitor 9c.

The base coat film 11 is formed of a single-layer film or a layered film of an inorganic insulating film of, for example, silicon nitride, silicon oxide, silicon oxide nitride, or the like.

The first TFT 9a is connected to the corresponding gate line 14 and source line 18f in each subpixel P as illustrated in FIG. 3. As illustrated in FIG. 4, the first TFT 9a includes a semiconductor layer 12a provided in an island shape on the base coat film 11, a gate insulating film 13 provided to cover the semiconductor layer 12a, a gate electrode 14a provided on the gate insulating film 13 to overlap a channel region of the semiconductor layer 12a, a first interlayer insulating film 15 and a second interlayer insulating film 17, which are provided sequentially in that order to cover the gate electrode 14a, and a source electrode 18a and a drain electrode 18b, which are provided on the second interlayer insulating film 17 to be spaced apart from each other. Note that the source electrode 18a and the drain electrode 18b are connected respectively to a source region and a drain region of the semiconductor layer 12a via each of contact holes formed in a layered film including the gate insulating film 13, the first interlayer insulating film 15, and the second interlayer insulating film 17. The gate insulating film 13, the first interlayer insulating film 15, and the second interlayer insulating film 17 are formed of a single-layer film or a layered film of an inorganic insulating film of, for example, silicon nitride, silicon oxide, silicon oxynitride, or the like.

The second TFT 9b is connected to the corresponding first TFT 9a and power source line 18g in each subpixel P as illustrated in FIG. 3. As illustrated in FIG. 4, the second TFT 9b includes a semiconductor layer 12b provided in an island shape on the base coat film 11, the gate insulating film 13 provided to cover the semiconductor layer 12b, a gate electrode 14b provided on the gate insulating film 13 to overlap a channel region of the semiconductor layer 12b, the first interlayer insulating film 15 and the second interlayer insulating film 17, which are provided sequentially in that order to cover the gate electrode 14b, and a source electrode 18c and a drain electrode 18d, which are provided on the second interlayer insulating film 17 to be spaced apart from each other. Note that the source electrode 18c and the drain electrode 18d are connected respectively to a source region and a drain region of the semiconductor layer 12b via each of the contact holes formed in the layered film including the gate insulating film 13, the first interlayer insulating film 15, and the second interlayer insulating film 17. In the present embodiment, the first TFT 9a and the second TFT 9b are described as being of a top gate type; however, the first TFT 9a and the second TFT 9b may be a bottom gate type.

The capacitor 9c is connected to the corresponding first TFT 9a and power source line 18g in each subpixel P as illustrated in FIG. 3. The capacitor 9c includes, as illustrated in FIG. 4, a lower conductive layer 14c formed of the same material and in the same layer as those of the gate electrodes 14a and 14b, the first interlayer insulating film 15 provided to cover the lower conductive layer 14c, and an upper conductive layer 16 provided on the first interlayer insulating film 15 to overlap the lower conductive layer 14c.

The flattening film 19 has a flat surface in the display region D, and is formed, for example, of an organic resin material such as a polyimide resin.

The organic EL element 25 includes, as illustrated in FIG. 4, a plurality of first electrodes (pixel electrodes, anode electrodes) 21a, an edge cover 22, a plurality of organic EL layers 23, and a second electrode (common electrode, cathode electrode) 24, which are provided sequentially on the TFT layer 20.

As illustrated in FIG. 4, the plurality of first electrodes 21a are provided, each corresponding to each of the plurality of subpixels P, in a matrix shape over the flattening film 19. As illustrated in FIG. 4, the first electrode 21a is connected to the drain electrode 18d of each of the second TFTs 9b via a contact hole formed in the flattening film 19. The first electrode 21a functions to inject holes (positive holes) into the organic EL layer 23. The first electrode 21a is preferably formed of a material having a large work function to improve the efficiency of hole injection into the organic EL layer 23. Examples of materials constituting the first electrode 21a include metallic materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Examples of materials constituting the first electrode 21a may include an alloy such as astatine (At)/astatine oxide (AtO$_2$). Examples of materials constituting the first electrode 21a may include electrically conductive oxides such as tin oxide (SnO), zinc oxide (ZnO), indium tin oxide (ITO), and indium zinc oxide (IZO). The first electrode 21a may be formed by layering a plurality of layers formed of any of the materials described above. Note that, examples of compound materials having a large work function include indium tin oxide (ITO) and indium zinc oxide (IZO).

As illustrated in FIG. 4, the edge cover 22 is provided in a lattice pattern to cover a peripheral portion of each of the first electrodes 21a. Examples of materials constituting the edge cover 22 include organic films of, for example, polyimide resin, acrylic resin, polysiloxane resin, and novolak resin.

As illustrated in FIG. 4, the plurality of organic EL layers 23 are disposed on each of the first electrodes 21a and are each provided in a matrix shape to correspond to the plurality of subpixels. As illustrated in FIG. 5, each of the organic EL layers 23 includes a hole injection layer 1, a hole transport layer 2, a light-emitting layer 3, an electron transport layer 4, and an electron injection layer 5, which are provided sequentially in that order over the first electrode 21a.

The hole injection layer 1 is also referred to as an anode buffer layer, and functions to reduce an energy level difference between the first electrode 21a and the organic EL layer 23 to thereby improve the efficiency of hole injection into the organic EL layer 23 from the first electrode 21a. Examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the efficiency of hole transport from the first electrode 21a to the organic EL layer 23. Examples of materials constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where holes and electrons are injected from the first electrode 21a and the second electrode 24, respectively, and the holes and the electrons recombine, when a voltage is applied via the first electrode 21a and the second electrode 24. The light-emitting layer 3 is formed of a material having high light-emitting efficiency. Examples of materials constituting the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 functions to facilitate migration of electrons to the light-emitting layer 3 efficiently. Examples of materials constituting the electron transport layer 4 include oxadiazole derivative, triazole derivative, benzoquinone derivative, naphthoquinone derivative, anthraquinone derivative, tetracyanoanthraquinodimethane derivative, diphenoquinone derivative, fluorenone derivative, silole derivative, and metal oxinoid compound, as organic compounds.

The electron injection layer 5 functions to reduce an energy level difference between the second electrode 24 and the organic EL layer 23 to thereby improve the efficiency of electron injection into the organic EL layer 23 from the second electrode 24, and the electron injection layer 5 can lower the drive voltage of the organic EL element 25 by this function. Note that the electron injection layer 5 is also referred to as a cathode buffer layer. Examples of materials constituting the electron injection layer 5 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

As illustrated in FIG. 4, the second electrode 24 is provided to cover each of the organic EL layers 23 and the edge cover 22. The second electrode 24 functions to inject electrons into the organic EL layer 23. The second electrode 24 is preferably formed of a material having a small work function to improve the efficiency of electron injection into the organic EL layer 23. Examples of materials constituting the second electrode 24 include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (Lif). The second electrode 24 may be formed of alloys of magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al), for example. The second electrode 24 may be formed of an electrically conductive oxide such as tin oxide (SnO), zinc oxide (ZnO), indium tin oxide (ITO), and indium zinc oxide (IZO). The second electrode 24 may be formed by layering a plurality of layers of any of the materials described above. Note that, examples of materials having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

The sealing film 30a includes, as illustrated in FIG. 4, a first inorganic film 26, an organic film 27, and a second inorganic film 28, which are provided sequentially over the second electrode 24 to cover the second electrode 24, and functions to protect the organic EL layer 23 of the organic EL element 25 from water and oxygen.

The first inorganic film 26 and the second inorganic film 28 are formed, for example, of an inorganic insulating film such as a silicon nitride film, a silicon oxide film, and a silicon oxynitride film.

The organic film 27 is formed, for example, of an organic resin material such as an acrylic resin, an epoxy resin, a silicone resin, a polyurea resin, a parylene resin, a polyimide resin, and a polyamide resin.

As illustrated in FIG. 6, the organic EL display device 50a includes, in the frame region F, the resin substrate layer 10; and the base coat film 11, the gate insulating film 13, the first interlayer insulating film 15, and the second interlayer insulating film 17 which are provided sequentially over the resin substrate layer 10, a lead wiring line 18h and a dam wall W which are provided on the second interlayer insulating film 17, and the sealing film 30a provided to cover the lead wiring line 18h and the dam wall W.

A plurality of the lead wiring lines 18h are provided to extend parallel to each other in a direction orthogonal to a direction in which the terminal region T extends (in a horizontal direction in FIG. 1). One end portion of the lead wiring line 18h is electrically connected to a signal wiring line (the gate line 14, the source line 18f, the power source line 18g, or the like) provided in the display region D. The other end portion of the lead wiring line 18h extends toward the terminal region T. Note that, as illustrated in FIG. 6, the lead wiring line 18h is formed in the same layer and of the same material as those of the source line 18f, and the flattening film 19 is provided on the lead wiring line 18h. As illustrated in FIG. 6, the lead wiring line 18h is provided to extend to intersect with a perimeter edge surface of the flattening film 19. Here, in the frame region F, as illustrated in FIGS. 1 and 6, a perimeter edge portion of the flattening film 19 is disposed, and an organic buffer layer 8a is provided, as a second organic film, on a lower portion of an end face (perimeter edge surface) of the perimeter edge portion of the flattening film 19.

As illustrated in FIG. 6, the organic buffer layer 8a is provided in a frame shape in a plan view to cover the lower portion of the perimeter edge surface of the flattening film 19 and each of the lead wiring lines 18h on a side of the perimeter edge surface of the flattening film 19, the lead wiring lines 18h extending from the perimeter edge surface of the flattening film 19. Here, the organic buffer layer 8a is formed, for example, of an organic vapor deposition film such as an acrylic resin, a polyurea resin, a parylene resin, a polyimide resin, and a polyamide resin. An angle θa (see FIG. 8) formed by an end face of the organic buffer layer 8a and an upper face of the resin substrate layer 10 is, for example, approximately from 5° to 20°. An angle θb (see FIG. 8) formed by the end face of the flattening film 19 and the upper face of the resin substrate layer 10 is, for example, approximately from 25° to 90°. Note that, if the angle θa formed by the end face of the organic buffer layer 8a and the upper face of the resin substrate layer 10 is from 5° to 20°, it is possible to suppress an unnecessary residue left from a resist pattern (residual resist layer Rc) between the adjacent lead wiring lines 18h, as described below. If the angle θa exceeds 20°, the above-described unnecessary residue left from a resist pattern is more likely to occur, and if the angle θa is less than 5°, a width of the organic buffer layer 8a is wider, as a result of which a width of the frame region F is wider.

As illustrated in FIG. 1, the dam wall W is provided in a frame shape to surround the flattening film 19, and is configured to suppress enlargement of the organic film 27 of the sealing film 30a. As illustrated in FIG. 6, the dam wall W includes a first dam wall Wa provided in a frame shape on a side of the display region D and a second dam wall Wb provided in a frame shape to surround the first dam wall Wa. The first dam wall Wa and the second dam wall Wb are provided on each of the lead wiring lines 18h, and are formed in the same layer and of the same material as those of the flattening film 19. As illustrated in FIG. 6, the first dam wall Wa and the second dam wall Wb are provided with an organic buffer layer 8b, as a second organic film, at a lower portion of each of perimeter edge surfaces on the side of the display region D and on the opposite side to the display region D. Here, the organic buffer layer 8b is formed in the same layer and of the same material as those of the organic buffer layer 8a. Note that in the present embodiment, the first dam wall Wa and the second dam wall Wb formed in the same layer and of the same material as those of the flattening film 19 are described as an example, but the first dam wall Wa and the second dam wall Wb may be layered in the same layer and formed of the same material as those of both of the flattening film 19 and the edge cover 22, for example.

As illustrated in FIG. 6, in the frame region F, the organic film 27 of the sealing film 30a is provided, via the first inorganic film 26, on the perimeter edge portion of the flattening film 19, and on the perimeter edge surface of the first dam wall Wa on a side of the display region D and on an upper face of the first dam wall Wa. On an upper face of the second dam wall Wb, the first inorganic film 26 and the second inorganic film 28 of the sealing film 30a contact each other. Note that in the present embodiment, a configuration in which the organic film 27 is held back on the upper face of the first dam wall Wa is described as an example, but the organic film 27 may reach the upper face of the second dam wall Wb, for example.

In the organic EL display device 50a described heretofore, in each subpixel P, a gate signal is input into the first TFT 9a via the gate line 14 to thereby turn on the first TFT 9a, a predetermined voltage corresponding to a source signal is written in the gate electrode 14b of the second TFT 9b and the capacitor 9c via the source line 18f, the magnitude of current from the power source line 18g is specified based on a gate voltage of the second TFT 9b, and the specified current is supplied to the organic EL layer 23, whereby the light-emitting layer 3 of the organic EL layer 23 emits light to display an image. In the organic EL display device 50a, even when the first TFT 9a is turned off, the gate voltage of the second TFT 9b is held by the capacitor 9c, and thus, the light-emitting layer 3 is kept emitting light until a gate signal of the next frame is input.

Figure 10:
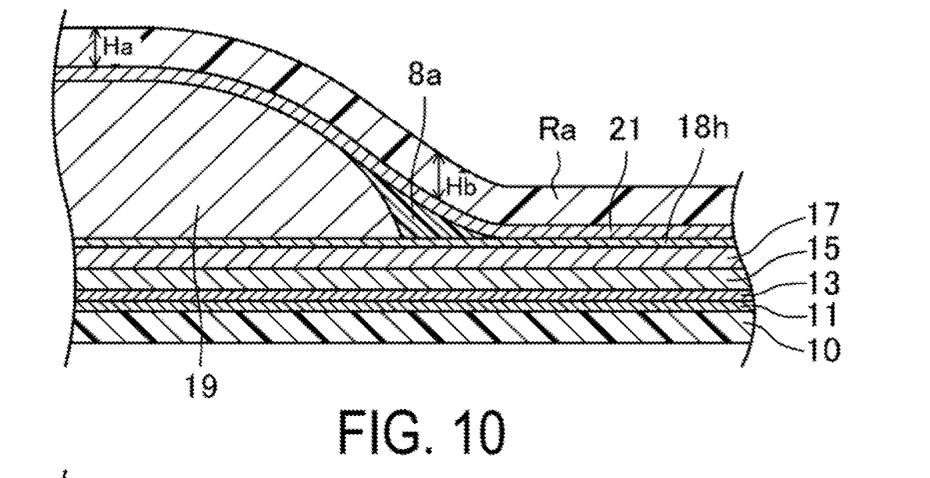
FIG. 10 is a cross-sectional view illustrating a resist applying step in the method of manufacturing the organic EL display device according to the first embodiment of the disclosure.
Figure 11:
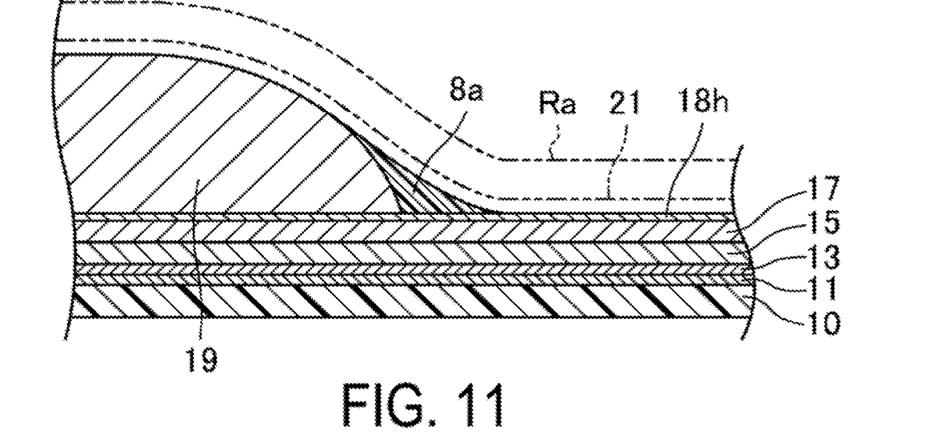
FIG. 11 is a cross-sectional view illustrating a state obtained after an etching step in the method of manufacturing the organic EL display device according to the first embodiment of the disclosure.
Figure 12:
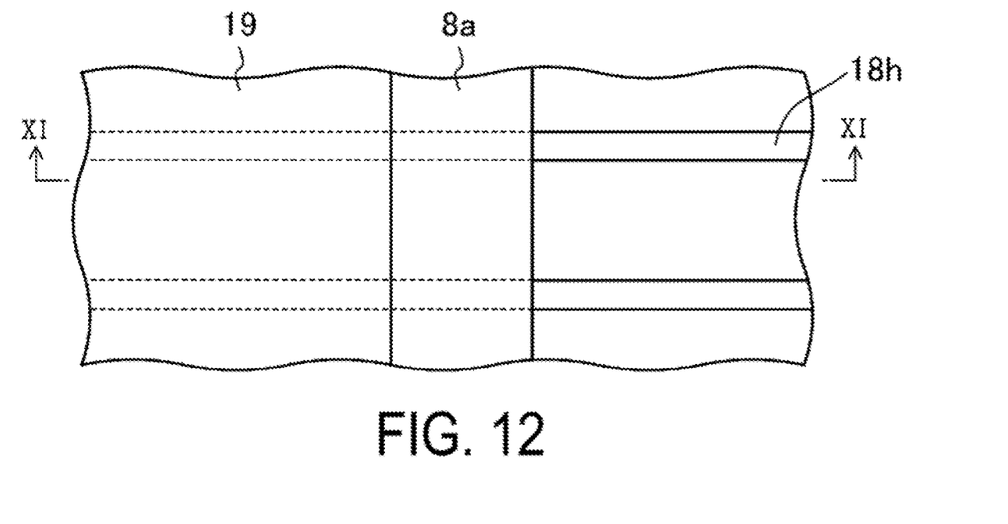
FIG. 12 is a plan view illustrating a state obtained after the etching step in the method of manufacturing the organic EL display device according to the first embodiment of the disclosure.
Figure 13:
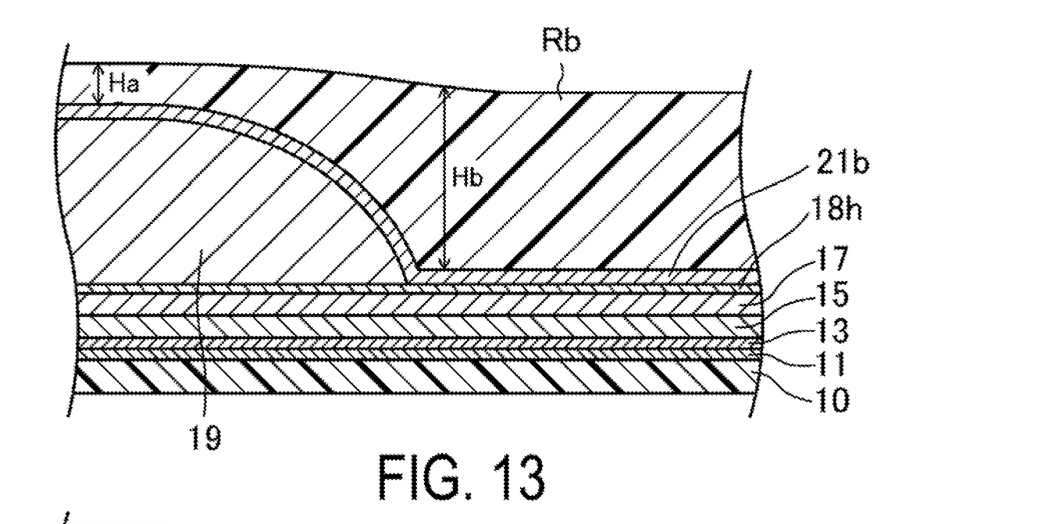
FIG. 13 is a cross-sectional view illustrating a resist applying step in a comparative example of the method of manufacturing the organic EL display device according to the first embodiment of the disclosure, where
Figure 14:
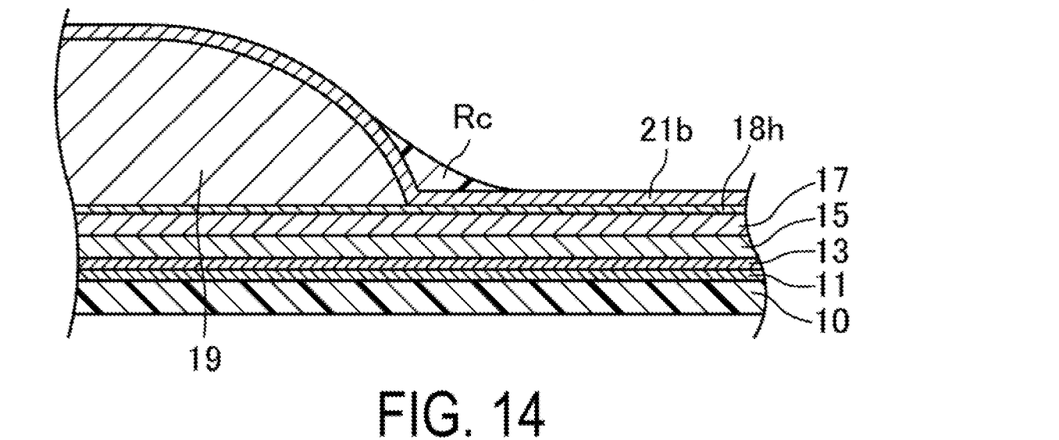
FIG. 14 is a cross-sectional view illustrating a state obtained before an etching step in the comparative example of the method of manufacturing the organic EL display device according to the first embodiment of the disclosure.
Figure 15:
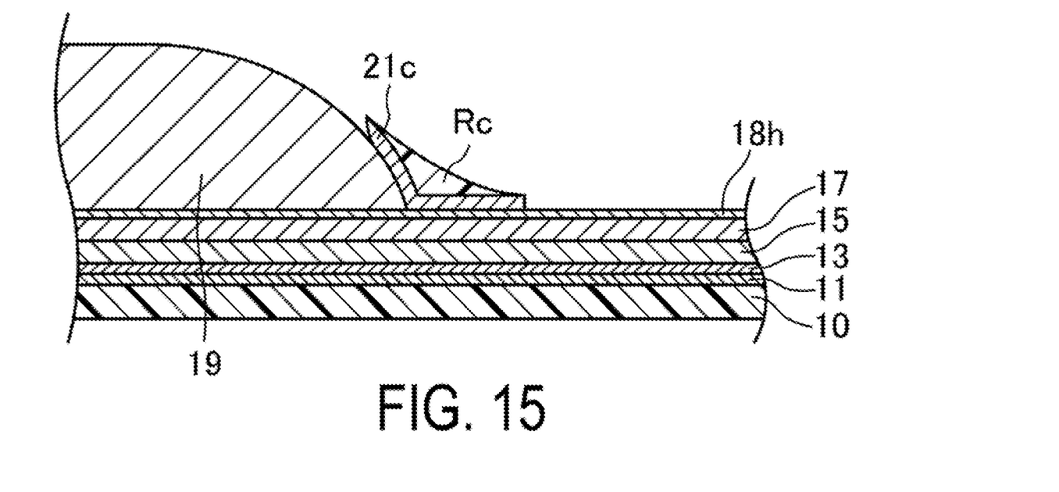
FIG. 15 is a cross-sectional view illustrating a state obtained after the etching step in the comparative example of the method of manufacturing the organic EL display device according to the first embodiment of the disclosure.
Figure 16:
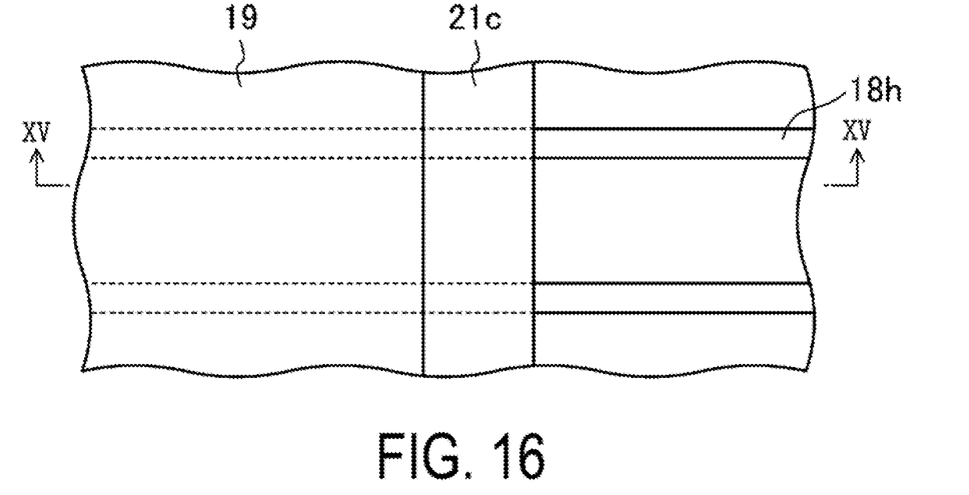
FIG. 16 is a plan view illustrating a state obtained after the etching step in the comparative example of the method of manufacturing the organic EL display device according to the first embodiment of the disclosure, where

Next, a method of manufacturing the organic EL display device 50a according to the present embodiment will be described using FIGS. 7 to 16. FIGS. 7, 8, 9, 10, and 11 are cross-sectional views illustrating an organic vapor deposition film forming step, an ashing step, an anode conductive film forming step, a resist applying step, and a state obtained after an etching step in the method of manufacturing the organic EL display device 50a. FIG. 12 is a plan view illustrating a state obtained after the etching step in the method of manufacturing the organic EL display device 50a. FIGS. 13, 14, and 15 are cross-sectional views illustrating a resist applying step, a state obtained before an etching step, and a state obtained after an etching step in a comparative example of the manufacturing method, where FIG. 13 is a view corresponding to FIG. 10. FIG. 16 is a plan view illustrating a state obtained after the etching step in the comparative example of the manufacturing method, where FIG. 16 is a view corresponding to FIG. 12. Note that the method of manufacturing the organic EL display device 50a according to the present embodiment includes a TFT layer forming step including the organic vapor deposition film forming step, the ashing step, the anode conductive film forming step, the resist applying step, and the etching step, an organic EL element forming step, and a sealing film forming step.

TFT Layer Forming Step

For example, the TFT layer 20 is formed by forming the base coat film 11, the first TFT 9a, the second TFT 9b, the capacitor 9c, as well as the flattening film 19, the first dam wall Wa and the second dam wall Wb on a surface of the resin substrate layer 10 formed on a glass substrate, and then forming the organic buffer layers 8a and 8b, by using a known method.

Figure 7:
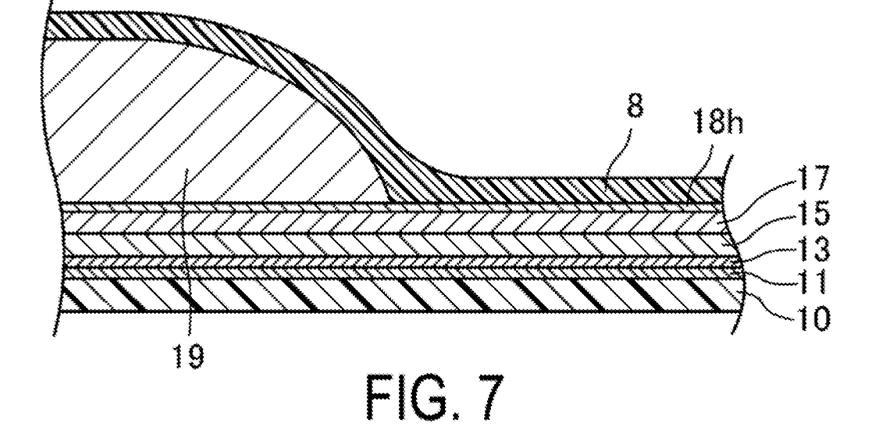
FIG. 7 is a cross-sectional view illustrating an organic vapor deposition film forming step in a method of manufacturing the organic EL display device according to the first embodiment of the disclosure.
Figure 8:
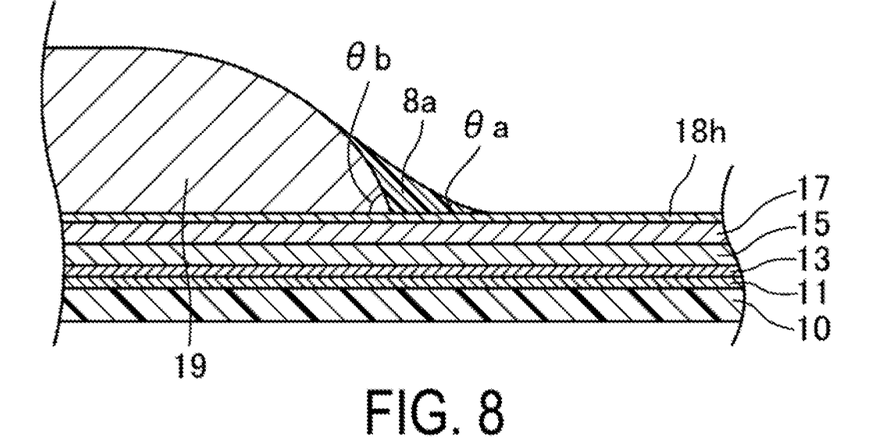
FIG. 8 is a cross-sectional view illustrating an ashing step in the method of manufacturing the organic EL display device according to the first embodiment of the disclosure.

Here, when the organic buffer layers 8a and 8b are formed, an organic vapor deposition film 8 made of an organic material such as an acrylic resin is formed to have a thickness of approximately 200 nm by using, for example, vacuum vapor deposition technique to cover the flattening film 19 (the first dam wall Wa and the second dam wall Wb) as illustrated in FIG. 7 (organic vapor deposition film forming step). Then, as illustrated in FIG. 8, by ashing the organic vapor deposition film 8, the organic buffer layer 8a is formed at the lower portion of the perimeter edge portion of the flattening film 19, and the organic buffer layer 8b is formed at the lower portions of the perimeter edge surfaces of the first dam wall Wa and second dam wall Wb (ashing step). Note that when the organic vapor deposition film 8 is formed, a material to be formed into the organic vapor deposition film 8 is adhered to the surface of the flattening film 19 in a dew condensation state (liquid state), and thus, due to the resulting surface tension, the organic vapor deposition film 8 is easily formed on the inclined perimeter edge portion of the flattening film 19.

Organic EL Element Forming Step

First, the organic EL element 25 is formed by forming the first electrode 21a, the edge cover 22, the organic EL layer 23 (the hole injection layer 1, the hole transport layer 2, the light-emitting layer 3, the electron transport layer 4, the electron injection layer 5), and the second electrode 24 on the TFT layer 20 formed in the above-described TFT layer forming step, by using a known method.

Figure 9:
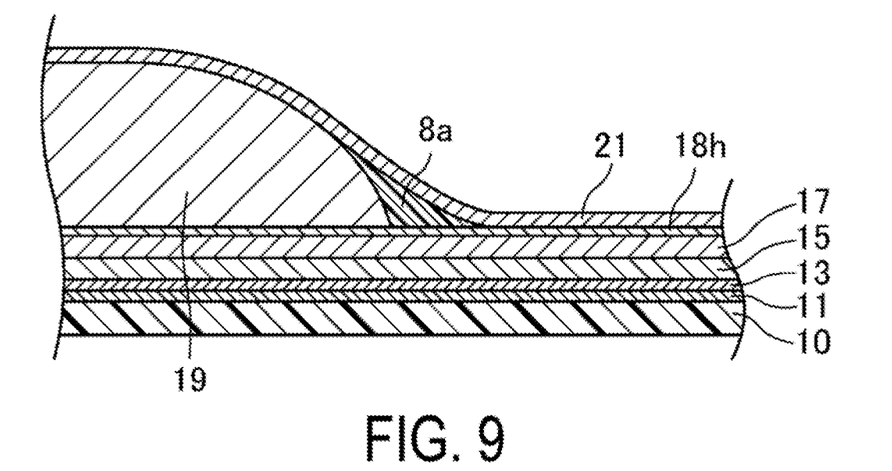
FIG. 9 is a cross-sectional view illustrating an anode conductive film forming step in the method of manufacturing the organic EL display device according to the first embodiment of the disclosure.

Here, when the first electrode 21a is formed, as illustrated in FIG. 9, the anode conductive film 21 is formed by forming, on the substrate surface on which the organic buffer layers 8a and 8b are formed, an ITO film/silver alloy film (MgAg film)/ITO film to have a thickness of approximately 200 nm by using, for example, a sputtering method (anode conductive film forming step). Then, as illustrated in FIG. 10, a resist material is applied to the anode conductive film 21 to form a resist applied film Ra (resist applying step). Here, the organic buffer layer 8a is interposed between the resist applied film Ra and the flattening film 19, and thus, a film thickness Ha of the resist applied film Ra over a flat surface of the flattening film 19 and a film thickness Hb of the resist applied film Ra over a periphery of the flattening film 19 are substantially the same. Then, the resist applied film Ra is exposed and developed to form a resist pattern, and then the anode conductive film 21 exposed from the resist pattern is etched to form the first electrode 21a (etching step). Note that, as illustrated in FIGS. 11 and 12, the resist pattern is not interposed in the frame region F of the substrate on which the first electrode 21a is formed, and thus, the anode conductive film 21 is removed, the organic buffer layer 8a is formed on the perimeter edge portion of the flattening film 19, and the organic buffer layer 8b is formed on the perimeter edge portions of the first dam wall Wa and second dam wall Wb.

In contrast, if the organic buffer layers 8a and 8b are not formed, an anode conductive film 21b is formed by forming, on the substrate surface on which the flattening film 19, the first dam wall Wa, and the second dam wall Wb are formed, an ITO film/silver alloy film (MgAg film)/ITO film to have a thickness of approximately 200 nm by using, for example, a sputtering method (see FIG. 13). Then, as illustrated in FIG. 13, a resist material is applied to the anode conductive film 21 to form a resist applied film Rb (resist applying step). Here, the organic buffer layer 8a is not interposed between the resist applied film Rb and the flattening film 19, and thus, the film thickness Hb of the resist applied film Rb over the periphery of the flattening film 19 is greater than the film thickness Ha of the resist applied film Rb over the flat surface of the flattening film 19. Therefore, the resist applied film Rb is exposed and developed to form a resist pattern, and then an originally unnecessary residual resist layer Rc remains at the perimeter edge portion of the flattening film 19, as illustrated in FIG. 14. As a result, when the anode conductive film 21b exposed from the resist pattern is etched to form the first electrode 21a, a residual anode conductive layer 21c is formed at the perimeter edge portion of the flattening film 19, as illustrated in FIG. 15 (etching step). Note that, as illustrated in FIGS. 15 and 16, the residual resist layer Rc is interposed in the frame region F of the substrate on which the first electrode 21a is formed, and thus, the residual anode conductive layer 21c is formed at the perimeter edge portion of the flattening film 19, and a short-circuit occurs between the adjacent lead wiring lines 18h through the residual anode conductive layer 21c.

Here, if the angle formed by the perimeter edge surface of the flattening film 19 and the upper face of the resin substrate layer 10 be 20° or less without forming the organic buffer layer 8a, the above-described formation of the residual resist layer Rc and the residual anode conductive layer 21c can be suppressed, but a following problem may occur. Specifically, if foreign matter is present in a portion where the flattening film 19 is formed thinly at the perimeter edge portion, defects and the like may occur due to the foreign materials, and the surface of the perimeter edge portion of the flattening film 19 may have an uneven shape. This makes it difficult to form a structure with a narrow width and a flat upper face at the same time as the formation of the flattening film 19, and thus, it is difficult to use the flattening film 19 to form the dam wall W.

Sealing Film Forming Step

First, the first inorganic film 26 is formed by using a mask to form, on the substrate surface on which the organic EL element 25 is formed in the above-described organic EL element forming step, an inorganic insulating film such as a silicon nitride film, a silicon oxide film, and a silicon oxynitride film to have a thickness of approximately 1000 nm by using a plasma CVD.

Next, the organic film 27 is prepared by forming, on the substrate surface on which the first inorganic film 26 is formed, a film of an organic resin material such as an acrylic resin to have a thickness of approximately 10 μm by using, for example, an ink-jet method.

Then, the second inorganic film 28 is formed by using a mask to form, on the substrate on which the organic film 27 is formed, an inorganic insulating film such as a silicon nitride film, a silicon oxide film, and a silicon oxynitride film to have a thickness of approximately 500 nm by using the plasma CVD, as a result which the sealing film 30a is formed.

Finally, laser light irradiation is applied from the glass substrate of the resin substrate layer 10 after a protective sheet (not illustrated) is bonded to the substrate surface on which the sealing film 30a is formed, as a result of which the glass substrate is peeled from a lower face of the resin substrate layer 10, and then, a protective sheet (not illustrated) is bonded to the lower face of the resin substrate layer 10 from which the glass substrate is peeled.

The organic EL display device 50a of the present embodiment can be manufactured in this manner.

As described above, according to the organic EL display device 50a and the method of manufacturing the same of the present embodiment, the organic buffer layer 8a is provided to cover the lower portion of the perimeter edge surface of the flattening film 19 constituting the TFT layer 20 and each of the lead wiring lines 18h on the side of the perimeter edge surface of the first organic film 19, the lead wiring lines 18h extending from the perimeter edge surface of the flattening film 19. Thus, when the first electrode 21a constituting the organic EL element 25 is formed on the flattening film 19, the thickness of the pattern of the resist applied film Ra applied on the anode conductive film 21 is more likely to be uniform even at the perimeter edge portion of the flattening film 19. As a result, a desired resist pattern is formed on the anode conductive film 21 using the resist applied film Ra having a uniform thickness, and thus, when the anode conductive film 21 is etched to form the first electrode 21a, the anode conductive film 21 is less likely to remain between the plurality of lead wiring lines 18h constituting the TFT layer 20. Therefore, in the organic EL display device 50a, a short-circuit between the lead wiring lines 18h can be suppressed.

According to the organic EL display device 50a and the method of manufacturing the same of the present embodiment, the organic buffer layer 8b is provided at the lower portion of each of the perimeter edge surfaces of the first dam wall Wa on the side of the display region D and on the opposite side to the display region D and at the lower portion of each of the perimeter edge surfaces of the second dam wall Wb on the side of the display region D and on the opposite side to the display region D. Thus, when the first electrode 21a constituting the organic EL element 25 is formed on the flattening film 19, the thickness of the pattern of the resist applied film Ra applied on the anode conductive film 21 is more likely to be uniform in the periphery of the first dam wall Wa and the second dam wall Wb. As a result, a desired resist pattern is formed on the anode conductive film 21 using the resist applied film Ra having a uniform thickness, and thus, when the anode conductive film 21 is etched to form the first electrode 21a, the anode conductive film 21 is further less likely to remain between the plurality of lead wiring lines 18h constituting the TFT layer 20. Therefore, in the organic EL display device 50a, a short-circuit between the lead wiring lines 18h can be further suppressed.

Second Embodiment

Figure 17:
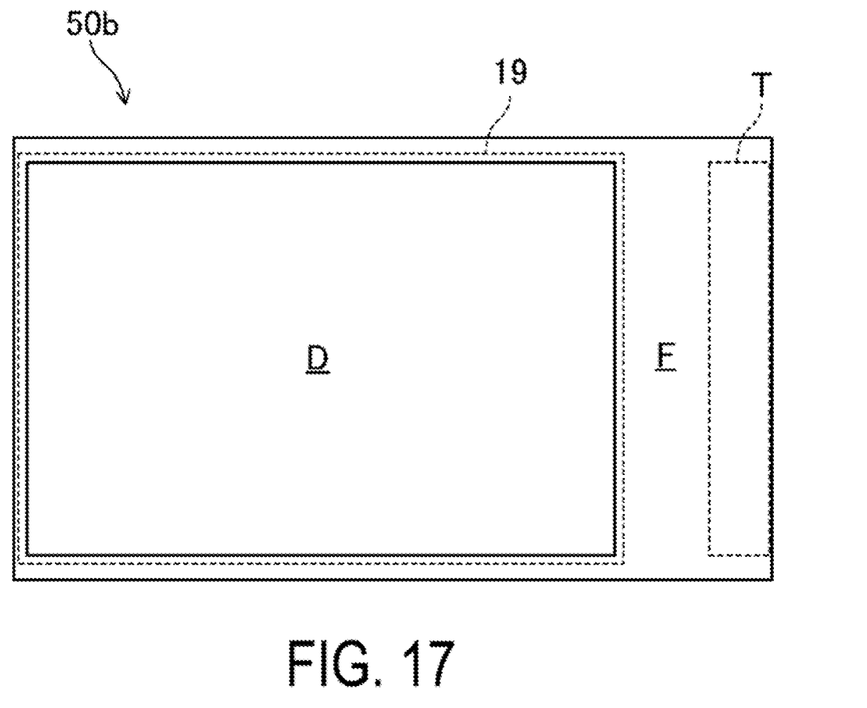
FIG. 17 is a plan view illustrating an overall configuration of an organic EL display device according to a second embodiment of the disclosure.
Figure 18:
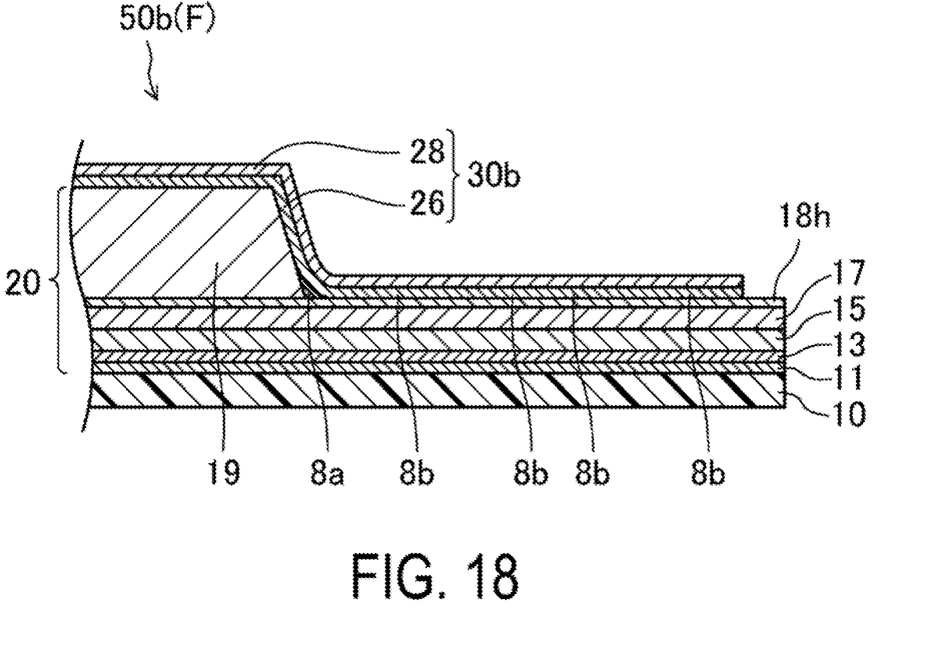
FIG. 18 is a cross-sectional view of a frame region of the organic EL display device according to the second embodiment of the disclosure, where
Figure 19:
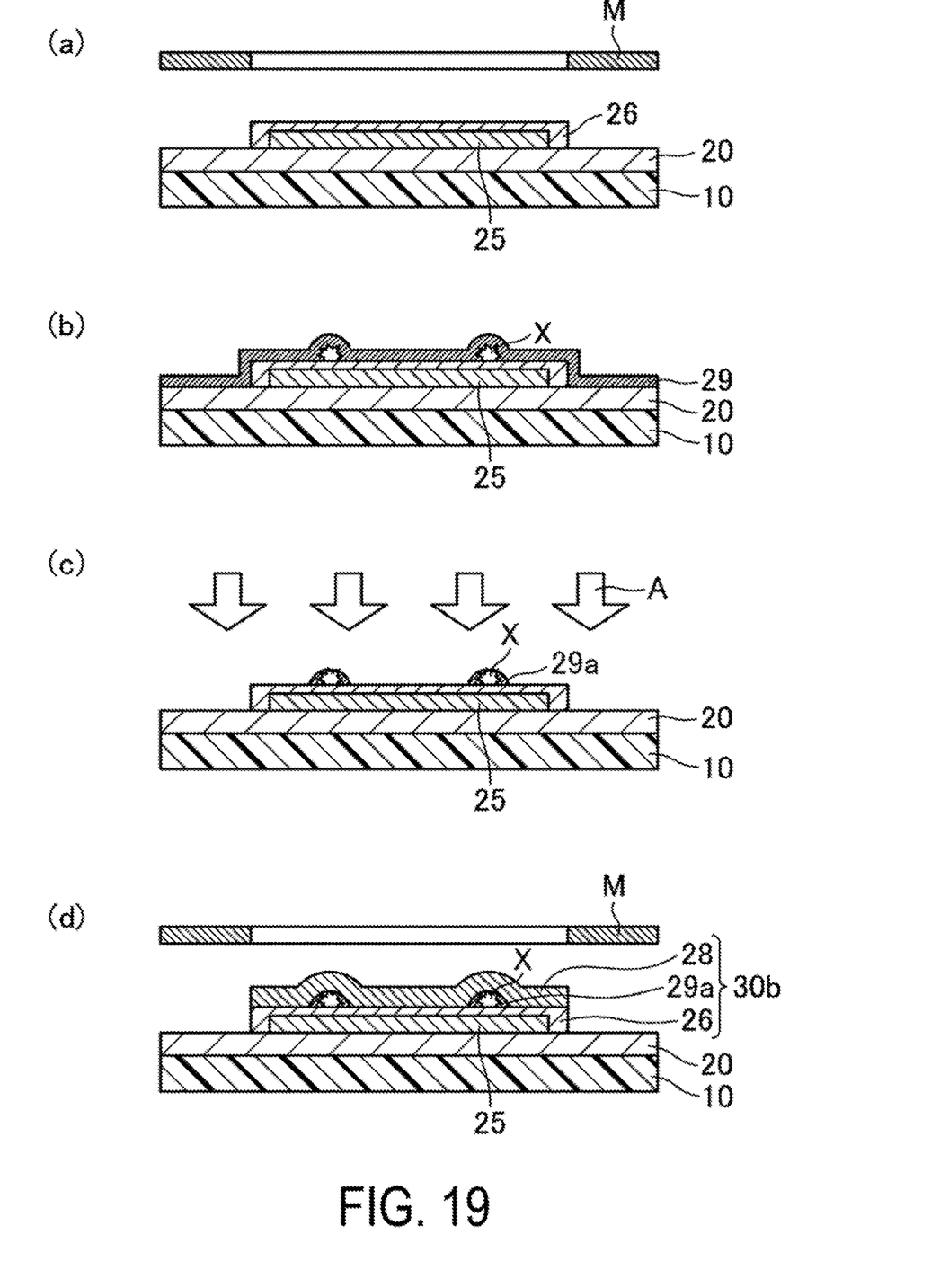
FIG. 19 is a cross-sectional view illustrating a method of manufacturing the organic EL display device according to the second embodiment of the disclosure.

FIGS. 17 to 19 illustrate a second embodiment of a display device and a method of manufacturing the same according to the disclosure. Here, FIG. 17 is a plan view illustrating an overall configuration of an organic EL display device 50b according to the present embodiment. FIG. 18 is a cross-sectional view of a frame region F of the organic EL display device 50b, where FIG. 18 is a view corresponding to FIG. 6. FIG. 19 is a cross-sectional view illustrating a method of manufacturing the organic EL display device 50b. Note that, in the following embodiment, portions identical to those in FIGS. 1 to 16 are denoted by the same reference signs, and their detailed descriptions are omitted.

In the above-described first embodiment, the organic EL display device 50a including the sealing film 30a including the first inorganic film 26, the organic film 27, and the second inorganic film 28 is described as an example. In the present embodiment, the organic EL display device 50b including a sealing film 30b including the first inorganic film 26, an organic buffer layer 29a, and the second inorganic film 28 is described as an example.

As illustrated in FIG. 17, the organic EL display device 50b, as with the organic EL display device 50a of the first embodiment, includes the display region D, in a rectangular shape, for displaying an image, and the frame region F provided in the periphery of the display region D. Note that, as illustrated in FIG. 17, the dam wall W (including the first dam wall Wa and the second dam wall Wb) (see FIG. 1) is not provided in the frame region F in the organic EL display device 50b.

As with the organic EL display device 50a of the first embodiment, the organic EL display device 50b includes, in the display region D, the resin substrate layer 10 provided as a base substrate, the TFT layer 20 provided on the resin substrate layer 10, the organic EL element 25 provided, on the TFT layer 20, as a light-emitting element constituting the display region D, and the sealing film 30b (see FIG. 18) provided to cover the organic EL element 25.

As illustrated in FIG. 18, the organic EL display device 50b includes, in the frame region F, the resin substrate layer 10, the base coat film 11, the gate insulating film 13, the first interlayer insulating film 15, and the second interlayer insulating film 17, which are provided sequentially on the resin substrate layer 10, the lead wiring line 18 h provided on the second interlayer insulating film 17, and the sealing film 30b provided to cover the lead wiring line 18h.

The sealing film 30b includes the first inorganic film 26 provided to cover the second electrode 24, an organic buffer layer 29a provided on the first inorganic film 26 (see FIG. 19(d)), and the second inorganic film 28 provided on the first inorganic film 26 to cover the organic buffer layer 29a, and functions to protect the organic EL layer 23 of the organic EL element 25 from water and oxygen. Note that in the present embodiment, a configuration in which foreign matter X, referred to as particles, are attached to the surface of the first inorganic film 26 is described as an example, but it goes without saying that a configuration in which the foreign matter X is not attached to the surface of the first inorganic film 26 is preferable.

As with the organic EL display device 50a of the first embodiment, the organic EL display device 50b described above is flexible and displays an image by causing the light-emitting layer 3 of the organic EL layer 23 to emit light as required via the first TFT 9a and the second TFT 9b in each subpixel P.

The organic EL display device 50b of the present embodiment can be manufactured by changing the sealing film forming step as follows in the method of manufacturing the organic EL display device 50a described above in the first embodiment.

Sealing Film Forming Step

First, as illustrated in FIG. 19(a), the first inorganic film 26 is formed by using a mask M to form, on the substrate surface on which the organic EL element 25 is formed in the above-described organic EL element forming step, an inorganic insulating film such as a silicon nitride film to have a thickness of approximately 1000 nm by using the plasma CVD.

Next, as illustrated in FIG. 19(b), an organic vapor deposition film 29 made of an organic material such as an acrylic resin is film-formed, on the entire surface of the substrate on which the first inorganic film 26 is formed, to have a thickness of approximately 200 nm by using, for example, the vacuum vapor deposition technique.

Then, as illustrated in FIG. 19(c), the organic vapor deposition film 29 is ashed with a plasma A to form the organic buffer layer 29a. Although a large portion of the organic vapor deposition film 29 is removed by being ashed with the plasma A, the organic vapor deposition film 29 below the foreign matter X (on the side of the resin substrate layer 10) remains to form the organic buffer layer 29a.

Then, as illustrated in FIG. 19(d), the second inorganic film 28 is formed to overlap the first inorganic film 26 by using the mask M to form, on the substrate surface on which the organic buffer layer 29a is formed, an inorganic insulating film such as a silicon nitride film to have a thickness of approximately 500 nm by using the plasma CVD, as a result of which the sealing film 30b is formed.

Finally, the resin substrate layer 10a on a side of the glass substrate is irradiated with laser light after a protective sheet (not illustrated) is bonded to the substrate surface on which the sealing film 30b is formed, as a result of which the glass substrate is peeled from a lower face of the resin substrate layer 10, and then, a protective sheet (not illustrated) is bonded to the lower face of the resin substrate layer 10 from which the glass substrate is peeled.

As described above, according to the organic EL display device 50b and the method of manufacturing the same of the present embodiment, the organic buffer layer 8a is provided to cover the lower portion of the perimeter edge surface of the flattening film 19 constituting the TFT layer 20 and each of the lead wiring lines 18h on the side of the perimeter edge surface of the first organic film 19, the lead wiring lines 18h extending from the perimeter edge surface of the flattening film 19. Thus, when the first electrode 21a constituting the organic EL element 25 is formed on the flattening film 19, the thickness of the pattern of the resist applied film Ra applied on the anode conductive film 21 is more likely to be uniform even at the perimeter edge portion of the flattening film 19. As a result, a desired resist pattern is formed on the anode conductive film 21 using the resist applied film Ra having a uniform thickness, and thus, when the anode conductive film 21 is etched to form the first electrode 21a, the anode conductive film 21 is less likely to remain between the plurality of lead wiring lines 18 h constituting the TFT layer 20. Therefore, in the organic EL display device 50b, a short-circuit between the lead wiring lines 18 h can be suppressed.

According to the organic EL display device 50b and the method of manufacturing the same of the present embodiment, unlike the organic EL display device 50a of the first embodiment, the dam wall W including the first dam wall Wa and the second dam wall Wb is not provided in the frame region F, and thus, the width of the frame region F is smaller, which enables frame narrowing of the organic EL display device 50b.

Other Embodiments

In each of the embodiments described above, the organic EL layer having a five-layer structure including the hole injection layer, the hole transport layer, the light-emitting layer, the electron transport layer, and the electron injection layer is exemplified. It is also possible that, for example, the organic EL layer may have a three-layer structure including a hole injection-cum-transport layer, a light-emitting layer, and an electron transport-cum-injection layer.

In each of the embodiments described above, the organic EL display device including the first electrode as an anode and the second electrode as a cathode is exemplified. The disclosure is also applicable to an organic EL display device, in which the layers of the structure of the organic EL layer are in the reverse order, with the first electrode being a cathode and the second electrode being an anode.

In each of the embodiments described above, the organic EL display device including an element substrate, in which the electrode of the TFT connected to the first electrode serves as the drain electrode, is exemplified. The disclosure is also applicable to an organic EL display device including an element substrate, in which the electrode of the TFT connected to the first electrode is referred to as the source electrode.

In each of the embodiments described above, the organic EL display device is described as a display device as an example. The disclosure is also applicable to a display device including a plurality of light-emitting elements that are driven by an electrical current. For example, the disclosure is applicable to a display device including Quantum-dot light emitting diodes (QLEDs), which are light-emitting elements using a quantum dot-containing layer.

INDUSTRIAL APPLICABILITY

As described above, the disclosure is useful for a flexible display device.

The invention claimed is:

1. A display device comprising:
a base substrate;
a TFT layer provided on the base substrate;
a light-emitting element provided on the TFT layer, the light-emitting element constituting a display region;
a frame region provided in a periphery of the display region;
a plurality of lead wiring lines provided to extend parallel to each other in the frame region, the plurality of lead wiring lines constituting the TFT layer;
a first organic film provided on each of the plurality of lead wiring lines, the first organic film constituting the TFT layer; and
a plurality of pixel electrodes provided on the first organic film, the plurality of pixel electrodes constituting the light-emitting element,
wherein each of the plurality of lead wiring lines extends to intersect with a perimeter edge surface of the first organic film, and
a second organic film is provided to cover a lower portion of the perimeter edge surface of the first organic film and each of the plurality of lead wiring lines on a side of the perimeter edge surface of the first organic film, the plurality of lead wiring lines extending from the perimeter edge surface of the first organic film,
wherein the first organic film is formed of a flattening film having a flat surface in the display region,
the display device comprising:
a sealing film provided to cover the light-emitting element, the sealing film being formed by sequentially layering a first inorganic film, an organic film, and a second inorganic film on the light-emitting element; and
a dam wall configured to suppress enlargement of the organic film, the dam wall being provided in a frame shape and being formed in the same layer and of the same material as a layer and material of the flattening film to surround the flattening film in the frame region,
wherein the dam wall is provided on each of the plurality of lead wiring lines, and
the second organic film is provided at a lower portion of each of the perimeter edge surfaces of the dam wall on a side of the display region and on an opposite side to the display region.

2. The display device according to claim 1,
wherein the dam wall includes a first dam wall provided in a frame shape on the side of the display region and a second dam wall provided in a frame shape to surround the first dam wall, and the organic film is provided on the perimeter edge surface of the first dam wall on the side of the display region and on an upper face of the first dam wall via the first inorganic film.

3. The display device according to claim 2,
wherein the first inorganic film and the second inorganic film contact each other on an upper face of the second dam wall.

4. The display device according to claim 1,
wherein the light-emitting element is an organic EL element.

5. A method of manufacturing a display device, the method comprising:
a TFT layer forming step of forming a TFT layer on a base substrate; and
a light-emitting element layer forming step of forming a light-emitting element layer constituting a display region on the TFT layer,
wherein a frame region is provided in a periphery of the display region,
a plurality of lead wiring lines constituting the TFT layer are provided to extend parallel to each other in the frame region,
a first organic film constituting the TFT layer is provided on each of the plurality of lead wiring lines,
a plurality of pixel electrodes constituting the light-emitting element layer are provided on the first organic film,
each of the plurality of lead wiring lines is provided to extend to intersect with a perimeter edge surface of the first organic film, and
in the TFT layer forming step, a second organic film is formed to cover a lower portion of the perimeter edge surface of the first organic film and each of the plurality of lead wiring lines on a side of the perimeter edge surface of the first organic film, the plurality of lead wiring lines extending from the perimeter edge surface of the first organic film, by forming an organic vapor deposition film by vapor deposition to cover the first organic film, and subsequently ashing the organic vapor deposition film.

6. The method of manufacturing a display device according to claim 5, comprising:
a sealing film forming step of forming, after the light-emitting element forming step, a first inorganic film to cover the light-emitting element, subsequently forming an organic film by an ink-jet method on the first inorganic film, and further forming a second inorganic film to cover the organic film.

7. The method of manufacturing a display device according to claim 5, comprising:
a sealing film forming step of forming, after the light-emitting element forming step, a first inorganic film to cover the light-emitting element, subsequently forming another organic vapor deposition film by vapor deposition to cover the first inorganic film, and further forming a second inorganic film to cover the first inorganic film after ashing the another organic vapor deposition film.

8. The method of manufacturing a display device according to claim 5,
wherein the light-emitting element is an organic EL element.

* * * * *